United States Patent
Yokoyama

[11] 4,206,419
[45] Jun. 3, 1980

[54] POWER AMPLIFIER

[75] Inventor: Kenji Yokoyama, Hamamatsu, Japan

[73] Assignee: Nippon Gakki Seizo Kabushiki Kaisha, Hamamatsu, Japan

[21] Appl. No.: 1,827

[22] Filed: Jan. 8, 1979

[30] Foreign Application Priority Data

Jan. 18, 1978 [JP] Japan ............................ 53-3902

[51] Int. Cl.² .................................... H03F 3/21
[52] U.S. Cl. .................................... 330/263; 330/156; 330/265; 330/297
[58] Field of Search ............... 330/156, 263, 265, 267, 330/268, 273, 274, 296, 297, 151, 295

[56] References Cited
U.S. PATENT DOCUMENTS
4,115,739  9/1978  Sano et al. ..................... 330/263

Primary Examiner—James B. Mullins
Attorney, Agent, or Firm—Cushman, Darby & Cushman

[57] ABSTRACT

A power amplifier comprises: a complementary symmetry push-pull circuit formed with two complementary transistors mutually coupled at their emitters and having an operating point for Class-A mode operation; a floating power supply having a neutral terminal serving as the output terminal of the power amplifier, a positive and a negative terminal connected respectively to the collectors of the respective transistors; a bootstrapping circuit for driving the mutually coupled emitters in proportion to the potential at the output terminal; and a circuit for negative feedback of signal from the output terminal to the bases of the transistors.

11 Claims, 3 Drawing Figures

POWER AMPLIFIER

BACKGROUND OF THE INVENTION a. Field of the Invention

The present invention relates to a power amplifier intended mainly for audio signal amplification, and more particularly, it is directed to an improvement of fidelity and power utility in such power amplifier.

b. Description of the Prior Art

A typical arrangement of conventional power amplifiers may be shown as in FIG. 1, wherein the power amplifier comprises: an output stage amplifier circuit for driving a load 7 of the power amplifier; and a driver stage circuit 2 which is illustrated as an operational or a differential amplifier circuit having an inverted input and a non-inverted input and being intended to drive the output stage amplifier circuit. The output stage amplifier circuit is comprised of a complementary symmetry push-pull circuit 3 which comprises a pair of transistors 4 and 5 coupled together at their emitters to form an output terminal 6 of the power amplifier. The amplifier load 7 such as a loud speaker is connected between the output terminal 6 and the ground, i.e. a fixed reference potential of the amplifier circuitry. The bases of the transistors 4 and 5 are coupled together via base biasing current sources 10 and 11 to an output terminal of the driver stage amplifier circuit 2. The collectors of the respective transistors 4 and 5 are supplied with operating voltage from a positive and a negative power source 8 and 9, respectively. Usually, the output terminal 6 is coupled, via a network circuit consisting of, for example, resistors 12 and 13, to the inverted input terminal of the driver stage circuit 2 for the purpose of negative feedback. An input signal (audio signal) applied at the input terminal 1 of the power amplifier is delivered to the non-inverted input of the driver stage circuit 2 to be voltage-amplified, and then it is fed to the output stage amplifier circuit for power amplification.

The transistors 4 and 5 are supplied with base biasing currents by the biasing current sources 10 and 11, respectively, so as to operate in either Class-A or Class-B mode. In the case of Class-B mode operation of the transistors 4 and 5, it is advantageously possible to increase the power utility factor of the complementary symmetry push-pull circuit 3 to a sufficient degree, but the circuit 3 inherently produces cross-over distortion due to the non-linearities of the transistors 4 and 5 at low current condition. In the case of Class-A mode operation of the circuit 3, on the other hand, the foregoing problem represented by cross-over distortion may be obviated, but the power utility factor of the circuit 3 is extermely lowered because of high power loss of the transistors 4 and 5 due to constant flowing of a relatively large amount of idling current. If the collector-emitter voltages of the transistors 4 and 5 are set at a low level, the power utility factor of the circuit 3 may be correspondingly improved, but there will be accompanied by a corresponding reduction in the allowable maximum output of the circuit 3.

As such, the aforementioned conventional arrangement is practically unable to provide a power amplifier having both high power utility factor and high fidelity as well as high output.

One technique of improving the performance of a power amplifier may be found in U.S. Pat. No. 4,115,739 granted on Sept. 19, 1978. According to this known technique, the junction point of the positive and negative power sources 8 and 9 in FIG. 1 of the present application is floated relative to the potential, and this junction point is driven by an additional driver amplifier in accordance with the potential of the amplifier output terminal 6 or input terminal 1. Such an arrangement permits the collector-emitter voltages of the transistors 4 and 5 to be set at a minimum level required for Class-A mode operation of these transistors, so that the output stage amplifier circuit 3 is able to operate at high power utility factor or with high efficiency in Class-A mode also. In this power amplifier, however, the circuit 3 is required to have a sufficient Supply Voltage Rejection Ratio (SVRR) to prevent undesirable effects due to large swinging in that collector potential of the transistors 4 and 5, which potential being varied with the potential of the output terminal of the power amplifier. The SVRR depends not only on the parameters of these transistors 4 and 5, but also it depends on other circuit conditions such as stray capacitance in the circuit 3. Thus, in general, it is not easy to attain a sufficiently good SVRR without substantial complication of the circuit configuration. If the SVRR is at an insufficient level, the operation characteristics of the output stage circuit 3 will be adversely affected by the characteristics of the additional driver amplifier, and thus the operation characteristics will be degraded considerably.

SUMMARY OF THE INVENTION

It is, therefore, a principal object of the present invention to provide an improved power amplifier.

A more specific object of the present invention is to provide an improved power amplifier which is capable of making power-amplification of signals with high fidelity, and which has high power utility and simple arrangement.

In a preferred example of the present invention which will be described hereinbelow in detail, the power amplifier comprises: an output amplifier circuit for driving a load in response to an input signal, said output amplifier circuit including a complementary symmetry push-pull circuit formed with a pair of transistors and having an operating point for Class-A mode; a floating power supply floated with respect to a fixed reference potential and having a nuetral terminal, a positive terminal connected to the collector of one of the pair of transistors in the output amplifier circuit and held at a substantially constant positive potential relative to the neutral terminal, and a negative terminal connected to the collector of the other one of the pair of transistors in the output amplifier circuit and held at a stustantially constant negative potential relative to the neutral terminal, the load being connected between the neutral terminal of the floating power supply and said fixed reference potential; a bootstrapping circuit for driving the junction point of the emitters of the transistors in the output amplifier circuit in proportion to the potential at the neutral terminal of the floating power supply, said neutral point serving as an output terminal of the power amplifier, said bootstrapping circuit including another complementary symmetry push-pull circuit formed with another pair of transistors and having an operation point for Class-AB or preferably Class-B mode operation; and a circuit means for performing negative feedback of signal from the neutral terminal to the input side of the output amplifier circuit.

The foregoing and other objects, the features and the advantages of the present invention will be pointed out in, or apparent from, the following description of the preferred embodiments considered together with the accompanying drawings.

BRIEF DESCRIPTION OF THE DRAWINGS

It should be understood that like parts are indicated by like reference numerals in FIGS. 2 and 3.

DETAILED DESCRIPTION OF THE PREFERRED EMBODIMENTS

Figure 1:
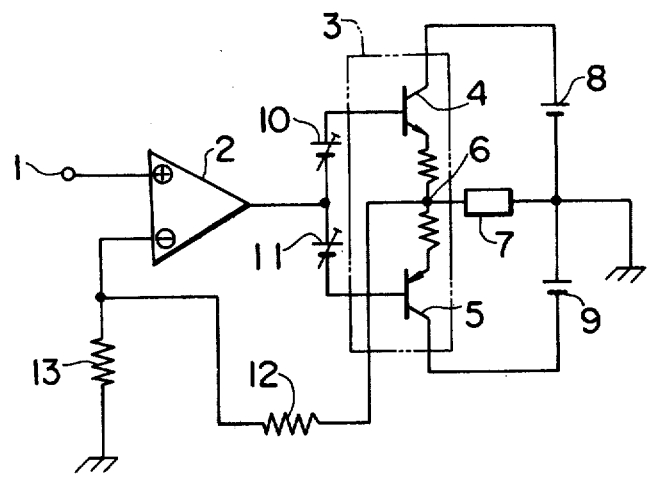
FIG. 1 is a schematic diagram of a typical power amplifier according to the prior art.
Figure 2:
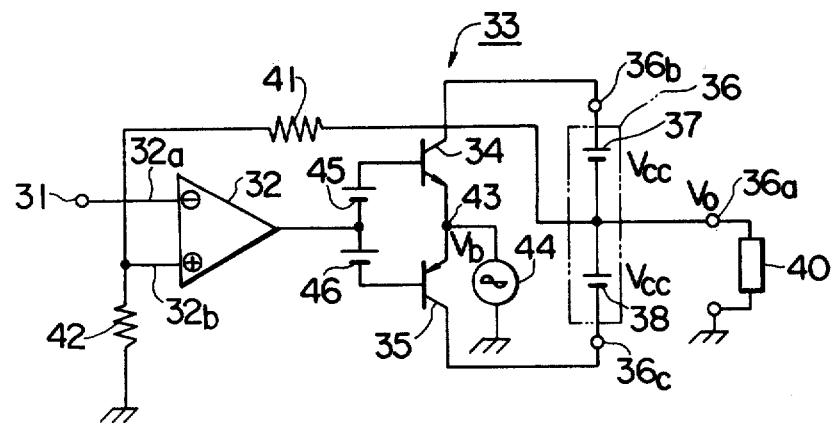
FIG. 2 is a schematic diagram of an embodiment of power amplifier according to the present invention.

FIG. 2 shows a basic example of power amplifier according to the present invention, which comprises an output amplifier circuit generally indicated at 33, a driver amplifier circuit 32 followed by the output amplifier circuit 33, a floating power supply 36, and a bootstrapping circuit 44. The output amplifier circuit 33 comprises a complementary symmetry push-pull circuit formed with an npn transistor 34 and a pnp transistor 35. The emitters of these transistors 34 and 35 are connected together at a junction point 43 to which the output of the bootstrapping circuit 44 is connected. The bases of the transistors 34 and 35 are coupled together via base biasing current sources 45 and 46 to the output of the dirver amplifier circuit 32 which is indicated as an operational amplifier with inverted and non-inverted inputs 32a and 32b. The transistors 34 and 35 are supplied with base biasing currents by the biasing current sources 45 and 46 so that the output amplifier circuit 33 may operate in Class-A mode. That is, the output amplifier circuit 33 has an operating point for Class-A mode. The floating power supply 36 has a neutral terminal 36a having a floating potential relative to the ground potential, a positive terminal 36b connected to the collector of the transistor 34, and a negative terminal 36c connected to the collector of the transistor 35. The floating power supply 36 is comprised on a positive power supply 37 for supplying the positive terminal 36b with a positive potential which is maintained substantially constant with respect to the potential at the nuetral terminal 36a, and a negative power supply 38 for supplying to the negative terminal 36c a substantially constant negative potential relative to the neutral terminal potential. The neutral terminal 36a serves as the output terminal of the power amplifier, to which a load 40 such as a loud speaker is connected. The bootstrapping circuit 44 is provided for driving the emitter junction point 43 in association with the potential $V_o$ at the output terminal 36a in such a manner that the potential $V_b$ at the emitter junction point 43 will vary in proportion to the output potential $V_o$. For instance, the junction point 43 is driven by the bootstrapping circuit 44 to have the same potential as that of the output potential $V_o$. The output terminal 36a is coupled via a resistor network of resistors 41 and 42 to the non-inverted input 32b of the driver amplifier circuit 32 for the purpose of negative feedback. The input terminal 31 of the power amplifier is connected to the inverted input 32a of the dirver amplifier circuit 32.

In operation, an input signal at the input terminal 31 is delivered to the inverted input 32a of the driver amplifier circuit 32 to be voltage-amplified and to be phase-inverted. The amplified input signal, in turn, is delivered to the output amplifier circuit 33 to be power-amplified. Thus, the load 40 such as a loud speaker is driven by the output amplifier circuit 33 in response to the input signal. In the output amplifier circuit 33, the collector-emitter voltage $V_{ce}$ for the transistors 34 and 35 is given by:

$$V_{ce} = V_o + V_{cc} - V_b$$

wherein $V_{cc}$ designates the supply voltage delivered from the respective power supplies 37 and 38. Therefore, in case the potential $V_b$ at the emitter junction point 43 is so controlled as to always coincide with the output potential $V_o$, the collector-emitter voltage $V_{ce}$ is maintained constant and equal to the supply voltage $V_{cc}$, irrespective of whether or not there is present an input signal to the power amplifier, and even regardless of the magnitude of this input signal. Hence, the supply voltage $V_{cc}$ can be determined to be at a minimized level required only to keep the transistors 34 and 35 in conductive state, so that the power loss in the transistors 34 and 35 is reduced greatly even when the output amplifier circuit 33 is operated in Class-A mode. Usually, the allowable minimum level of the supply voltage $V_{cc}$, although it is dependent upon the type of transistors employed, is about 2 to 5 volts.

As described above, the output amplifier circuit 33 according to the present invention has makedly reduced power loss, and therefore it exhibits much improved power Utility. Accordingly, if the power loss in the bootstrapping circuit 44 is sufficiently small, the power utility factor of the whole power amplifier of the present invention is increased extremely. This condition due to the bootstrapping circuit 44 can be easily satisfied by, for example, constructing the bootstrapping circuit 44 in the form of a push-pull circuit operable in Class-AB or preferably in Class-B mode. It should be noted here that possible distortions in the output voltage ($V_b$) of the bootstrapping circuit 44 can hardly affect the output voltage ($V_o$) of the power amplifier, in view of the negative feedback action, as will be explained below.

The output voltage $V_o$ may be given by the following formula, in connection with the output voltage $V_g$ of the dirver amplifier circuit 32, the open gain A of the driver amplifier circuit 32, and the output voltage $V_b$ of the bootstrapping circuit 44:

$$V_g = V_o \cdot A \frac{R_{42}}{R_{41} + R_{42}} \tag{1}$$

wherein $R_{41}$ and $R_{42}$ represent the resistance values of the resistors 41 and 42, respectively.

If using A' for $$A \cdot \frac{R_{42}}{R_{41} + R_{42}},$$

the above Equation (1) may become:

$$V_g = V_o \cdot A' \tag{2}$$

Alternatively, the output voltage $V_o$ may also be given by:

$$V_o = \frac{V_b - V_g}{R_i} \cdot (R_L // R_{41} + R_{42}) \quad (3)$$

wherein $R_L$ represents the impedance of the load 40, and $R_i$ represents the input impedance of the output amplifier circuit 33 with the transistors 34 and 35 being grounded at their bases. Using $R_L'$ for $(R_L//R_{41}+R_{42})$, the above Equation (3) may be expressed as:

$$V_o = \frac{V_b - V_g}{R_i} \cdot R_L' \quad (4)$$

From Equations (2) and (4), the following equation is derived.

$$\frac{V_o}{V_b} = \frac{1}{A' + R_i/R_L'} \quad (5)$$

In general, the condition of $A' >> (R_i/R_L')$ is met, and then Equation (5) may be expressed as:

$$\frac{V_o}{V_b} \doteq \frac{1}{A'} \quad (6)$$

Equation (6) indicates that destortions in the output voltage $V_b$ of the bootstrapping circuit has negligible effect upon the output voltage $V_o$ of the power amplifier, since the value of $A'$ usually is sufficiently large. That is, the bootstrapping circuit 44 may advantageously comprise a Class-B or Class-AB mode type amplifier circuit as will be described later.

Similarly, possible ripples in the supply voltage $V_{cc}$ will hardly give adverse effect upon the output voltage $V_o$ because of the negative feedback action.

Figure 3:
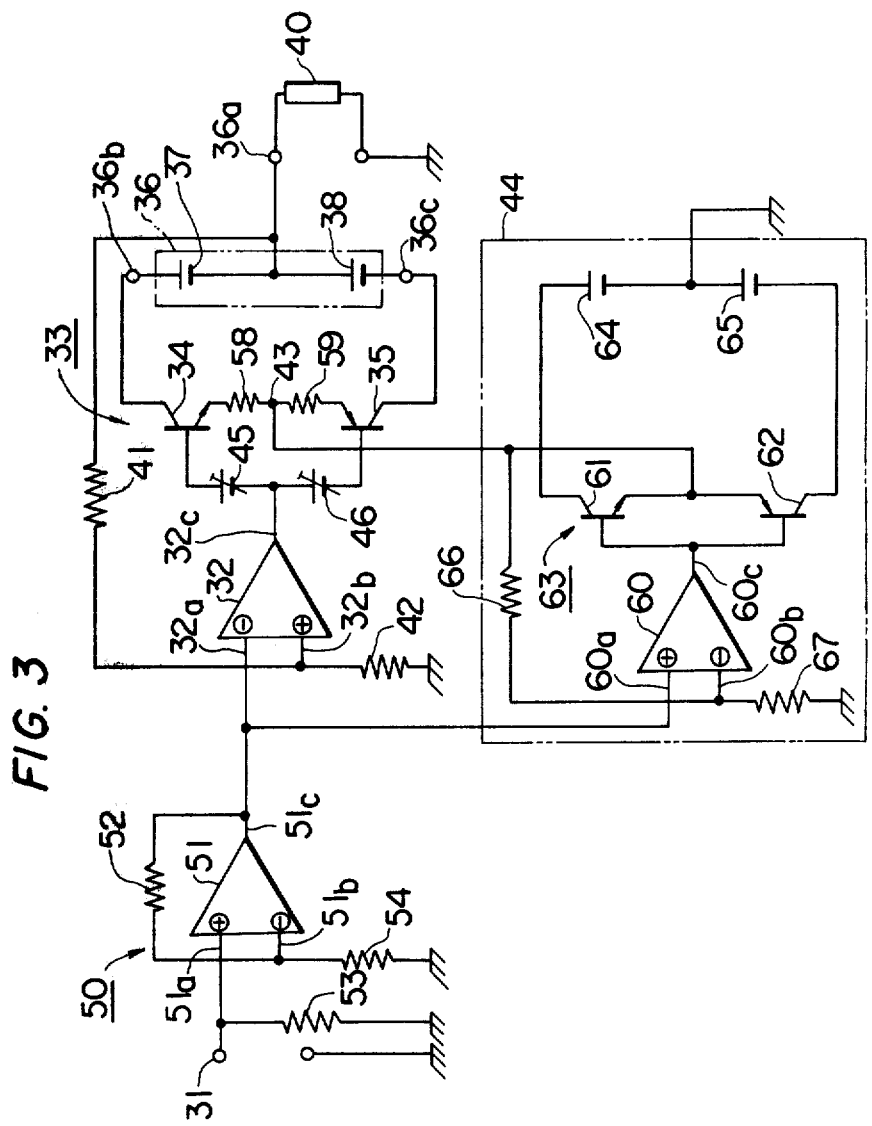
FIG. 3 is a schematic diagram of a more concrete embodiment of power amplifier in accordance with the present invention.

A more concrete and practical example of a power amplifier of the present invention is shown in FIG. 3, which also embodies an output amplifier circuit generally indicated at 33 and a driver amplifier circuit 32 which are similar to those used in the preceding example, and a bootstrapping circuit 44, and further comprises an input amplifier circuit generaly indicated at 50. In this example, the emitters of the transistors 34 and 35 are coupled together via protective resistors 58 and 59, respectively. The input amplifier circuit 50 comprises an operational or differential amplifier 51 with a non-inverted input 51a connected to the input terminal 31 and also grounded via a resistor 53, an inverted input 51b which is grounded via a resistor 54 and also connected via a resistor 52 to the output 51c of this amplifier 51. The output 51c of the amplifier 51 is fed to the inverted input 32a of the dirver amplifier circuit 32. The bootstrapping circuit 44 comprises an operational or differential amplifier 60 having a non-inverted input 60a connected to the output 51c of the input amplifier circuit 50, an inverted input 60b, and an output 60c. This bootstrapping circuit 44 further comprises a complementary symmetry push-pull circuit generally indicated at 63 formed with an npn transistor 61 and a pnp transistor 62, which circuit 63 being powered by a positive power supply 64 and a negative power supply 65. The emitters of these transistors 61 and 62 are connected together to form an output terminal which is connected to the emitter junction point 43 of the transistors 34 and 35 in the output amplifier circuit 33. The inverted input 60b is grounded via a resistor 67 and also connected via a resistor 66 to the output terminal of the circuit 63. The push-pull circuit 63 has an operating point for Class-B or Class-AB mode operation. The bootstrapping circuit 44 is driven by a signal delivered to the input 60a to produce a corresponding output signal $V_b$ at the output or the emitter junction point 43. Normally, the bootstrapping circuit 44 is designed to attain such gain that the junction point 43 and the output terminal 36a may be held always at substantially the same potential. In other words, the resistance ratio between the resistors 41 and 42 is set to be equal to that between the resistors 66 and 67.

In this example, the power loss in the bootstrapping circuit 44 is small because of the Class-B or Class-AB mode operation thereof, and also the power loss in the output amplifier circuit 33 is reduced to a low level as described above. Therefore, the overall power utility of the power amplifier is greatly improved. For achieving an increase in utility of power, needless to say, it is possible to design the bootstrapping circuit 44 to operate in Class-D mode. Furthermore, since the output amplifier circuit 33 is arranged to operate in Class-A mode, the power amplifier of the present invention provides high fidelity in its operation.

Additionally speaking, the word "bootstrapping" has been used herein to mean that the potential at the emitter junction point 43 is controlled so that a positive feedback action is effected on the output amplifier circuit 33. In FIG. 3, the potential variations at the bases of the transistors 34 and 35 are opposite in phase to the input signal of the amplifier 32. Therefore, the potential at the emitter junction 43 is controlled in opposite phase relative to the base potentials of the transistors 34 and 35.

While there have been shown and described some preferred embodiments of the present invention, it is to be understood that the present invention is not limited thereto but may be variously modified and practiced within the scope set forth in the attached claims.

What is claimed is:
1. A power amplifier, comprising:
   an output amplifier circuit comprising a complementary symmetry push-pull circuit formed with a first transistor of npn type having a base, an emitter and a collector, and a second transistor of pnp type having a base, an emitter coupled to the emitter of said first transistor, and a collector, and having an operating point for Class-A mode operation;
   a floating power supply floated with respect to a fixed reference potential and having a neutral terminal, a positive terminal connected to the collector of said first transistor for providing a positive potential relative to the neutral terminal, and a negative terminal connected to the collector of said second transistor for providing a negative potential relative to the neutral terminal; and
   a bootstrapping circuit for driving said coupled emitters of said first and second transistors in association with a potential at said neutral terminal of said floating power supply,
   said bases of said first and second transistors being driven in response to an input signal applied to an input terminal of said power amplifier,
   said neutral terminal serving as an output terminal of said power amplifier.
2. A power amplifier according to claim 1, in which: said coupled emitters of said first and second transistors are driven by said bootstrapping circuit in proportion to the potential at said output terminal of said power amplifier.

3. A power amplifier according to claim 1, in which: said coupled emitters of said first and second transistors are driven by said bootstrapping circuit so as to always have substantially the same potential as that at said output terminal of said power amplifier.

4. A power amplifier according to claim 1, further comprising: circuit means for coupling said output terminal of said power amplifier to said bases of said first and second transistors for negative feedback.

5. A power amplifier according to claim 4, in which: said circuit means comprises a driver amplifier circuit for driving said output amplifier circuit in response to the input signal applied to said input terminal of said power amplifier.

6. A power amplifier according to claim 5, in which: said driver amplifier circuit has an inverted input as said input terminal of said power amplifier, a non-inverted input, and an output coupled to said bases of said first and second transistors, and in which: said circuit means further comprises a resistor network for coupling between said non-inverted input of said driver amplifier circuit and said output terminal of said power amplifier.

7. A power amplifier according to claim 4, in which: said bootstrapping circuit comprises an amplifier circuit driven in response to the input signal applied to said input terminal of said power amplifier.

8. A power amplifier according to claim 7, in which: said amplifier circuit in said bootstrapping circuit has an operating point for either one of Class-B mode operation or Class-AB mode operation.

9. A power amplifier according to claim 8, in which: said amplifier circuit in said bootstrapping circuit is comprised of complementary symmetry push-pull circuit formed with a third transistor of npn type and a fourth transistor of pnp type; said third transistor having a base, an emitter, and a collector supplied with a positive voltage by a positive power supply; said fourth transistor having a base connected to said base of said third transistor, an emitter connected to the emitter of said third transistor and also to said coupled emitters of said first and second transistors, and a collector supplied with a negative voltage by a negative power supply, the coupled bases of said third and fourth transistors being driven in response to the input signal applied to the input terminal of said power amplifier.

10. A power amplifier according to claim 9, in which: said bootstrapping circuit further comprises a driver amplifier circuit for driving said complementary symmetry push-pull circuit of said bootstrapping circuit in response to the input signal applied to said input terminal of said power amplifier.

11. A power amplifier comprising:
a first amplifier for driving a load in response to an input signal, said first amplifier comprising a first complementary symmetry transistor push-pull circuit including an interconnection point of output electrodes of complementary transistors and having an operating point for Class-A operation;
a first power supply with a floating reference point for supplying a voltage to said first amplifier;
a second amplifier for driving said interconnection point of the complementary transistors in said first complementary symmetry transistor push-pull circuit in response to said input signal, said second amplifier comprising a second complementary symmetry transistor push-pull circuit and having an operating point for Class-AB or Class-B operation; and
a second power supply with a fixed reference point for supplying a voltage to said second amplifier, said first and second power supplies each comprising a positive power supply and a negative power supply interconnected at a common junction point, said load being connected to the junction point of said positive and negative power supplies of said first power supply.

* * * * *